(12) United States Patent
Luong

(10) Patent No.: US 11,749,937 B1
(45) Date of Patent: Sep. 5, 2023

(54) USB PORTABLE HOUSING MECHANISM UTILIZING WIRES/CABLES AND RUBBER BANDS/SPRINGS FOR LINEAR AND CIRCULAR DEPLOYMENT AND RETRACTION

(71) Applicant: Khiem G Luong, Poway, CA (US)

(72) Inventor: Khiem G Luong, Poway, CA (US)

( * ) Notice: Subject to any disclaimer, the term of this patent is extended or adjusted under 35 U.S.C. 154(b) by 0 days.

(21) Appl. No.: 17/553,843

(22) Filed: Dec. 17, 2021

(51) Int. Cl.
*H01R 13/52* (2006.01)
*H05K 5/02* (2006.01)
*H01R 13/447* (2006.01)

(52) U.S. Cl.
CPC ....... *H01R 13/5213* (2013.01); *H01R 13/447* (2013.01); *H05K 5/0278* (2013.01)

(58) Field of Classification Search
CPC .......................... H05K 5/0278; H01R 13/5213
See application file for complete search history.

(56) References Cited

U.S. PATENT DOCUMENTS

| 8,979,598 | B2 * | 3/2015 | Liao | H01R 31/06 439/730 |
| 10,483,704 | B1 * | 11/2019 | Solland | H01R 29/00 |
| 2008/0026614 | A1 * | 1/2008 | Emerson | H01R 13/447 439/136 |
| 2010/0221937 | A1 * | 9/2010 | Choi | H04M 1/0274 439/142 |

* cited by examiner

*Primary Examiner* — Michael C Zarroli

(57) ABSTRACT

This mechanical design intends to protect the USB from environmental damage via transfer of linear and circular motion to a housing which houses the USB chip. Unlike other USB housing products with only linear or circular motion, this engineering design does both in order to secure the USB port and enclosing it completely rather than just concealing it, without requiring a separable component. The mechanism is secured in place by applying constant tensile force to the mobile/movable components of the present invention.

1 Claim, 4 Drawing Sheets

USB PORTABLE HOUSING MECHANISM UTILIZING WIRES/CABLES AND RUBBER BANDS/SPRINGS FOR LINEAR AND CIRCULAR DEPLOYMENT AND RETRACTION

This invention is in the field of computer hardware peripherals, more particularly to portable flash storage devices on desktops, laptops, smartphones and tablets.

BACKGROUND OF INVENTION

USB Devices are used as a portable data storage devices and due to its lack of mechanical components, are a more impact resistant and durable alternative to disk based hard drives. Some products, such as the Corsair Flash Survivor, uses a threaded cap which forms a watertight seal when fully screwed. The problem with this design is simply that it is a two part product, and if one part was lost such as the threaded cap, it would lose waterproof capabilities.

BRIEF SUMMARY OF INVENTION

This USB 3.0 housing mechanical invention aims to solve the problem of needing two separable parts in order for it to be waterproof, shockproof, or any environmental challenges that it might face, via a system of springs hinges which keeps the USB port and the cavity which encapsulates it from not needing to be detached.

The most prominent mechanical advantage are the two legs which serves as a linear and circular movement point for the USB, a mechanical movement not found in any USB housing on the market. The USB will also be conveniently deployed or tucked away by a tension springs, requiring less manual work on the user. The purpose of this invention is to offer users the ability to back up their digital on a more reliable USB drive than that is waterproof as a result of its mechanical configuration. This invention is also compatible not just with Type-A Ports, but also adoptable for Type-C ports or other computer data-bus technologies.

Shown in the illustrative embodiment of the invention's assembly is the location of the key elements.

As will be understood from the following specifications, the USB housing will be constructed out of injection molded plastics to machined metals such as aluminum or titanium.

DETAILED DESCRIPTION OF THE DRAWINGS

Figure 1:
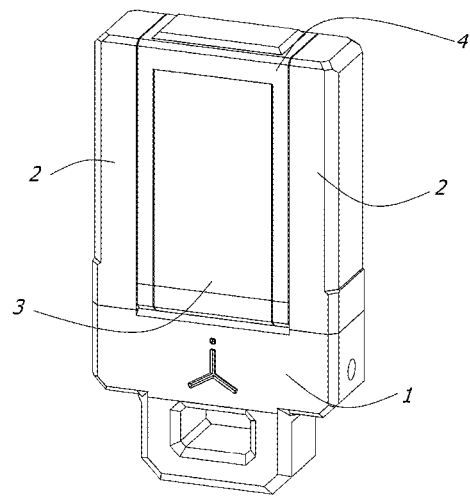
FIG. 1 is a diametric view of the present invention in retracted state; with the USB port encapsulated.

Referring to FIG. 1, the various parts are identified as the Base (1), 2 Legs (2), Plate (3), and Shell (4). These are the parts in relation to the present invention.

Figure 2:
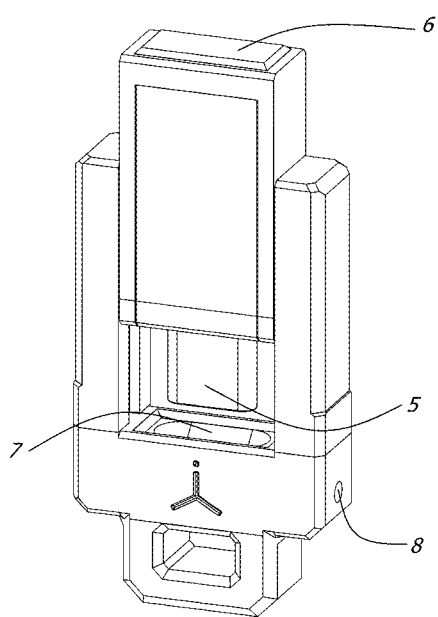
FIG. 2 is a diametric view of the present invention with the USB housing section pulled upwards, exposing the USB port.

Referring to FIG. 2, the present invention can be seen with the Shell (4) and Plate (3) part moving vertically upwards until the USB Port (5) and the Cavity (7) which it was housed in is exposed, which pulls on a tension spring housed within the 2 Legs (2) secured to the Base (1) with a hole on both sides (8). The male extrusion (6) on top of the Shell (4) is also identified.

Figure 3:
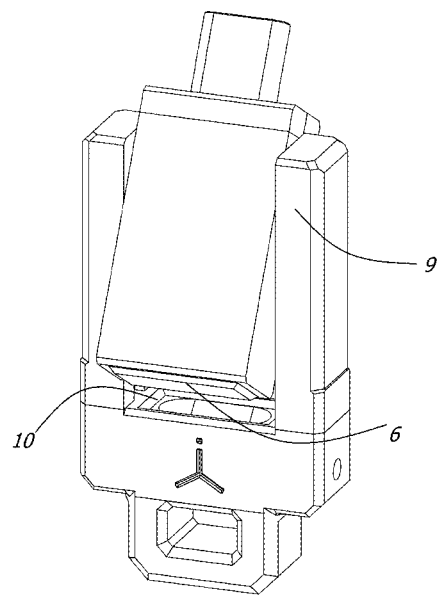
FIG. 3 is a diametric view of the present invention with the USB housing section rotated horizontally.

Referring to FIG. 3, the present invention can be seen rotated at the Axis point located at (9), at the 2 Legs (2) circular outer cavity (18). Here the male extrusion (6) can be seen aligning with the female pocket (10) which will allow the Shell (4) to not slip while in deployed state.

Figure 4:
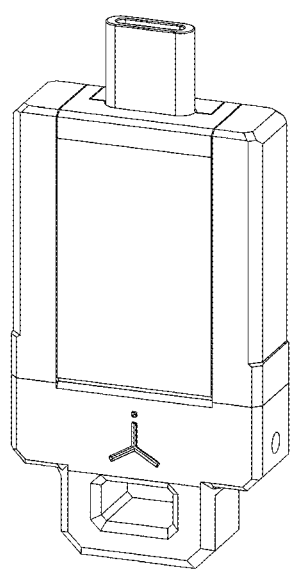
FIG. 4 is a diametric view of the present invention in deployed state; with the USB port exposed and vertically aligned to the length of the invention.

Referring to FIG. 4, the present invention can be seen in its deployed state.

Figure 5:
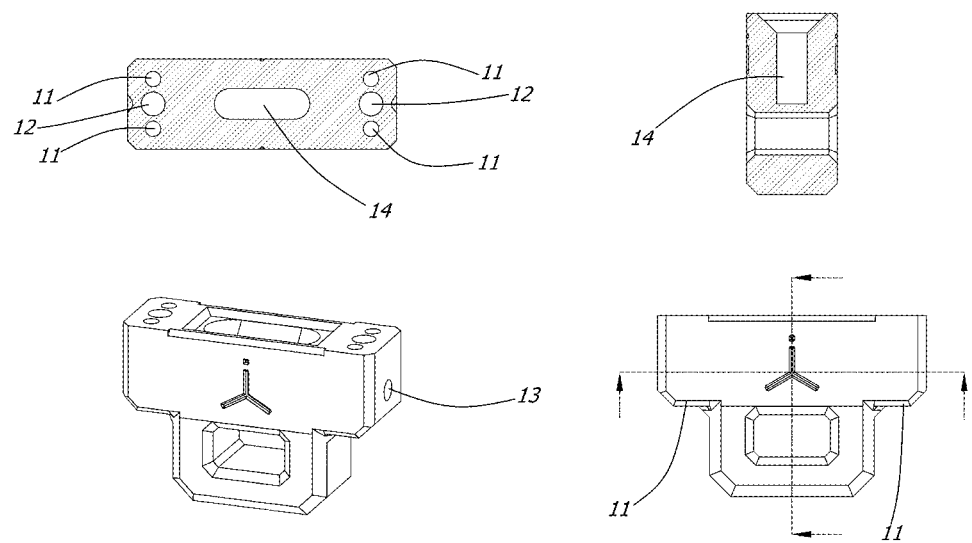
FIG. 5 is a detailed black-and-white line drawing of the Base Part.

Referring to FIG. 5, the drawing is a detailed diametric and orthographic cross section sketch of the Base (1). The 2 holes which the tension spring is housed in (12) and secured in (13) can be seen in between the 4 machine screw holes (11) which is used to fasten the Base (1) to the 2 Legs (2). The cavity for the USB connector (14) is also identified.

Figure 6:
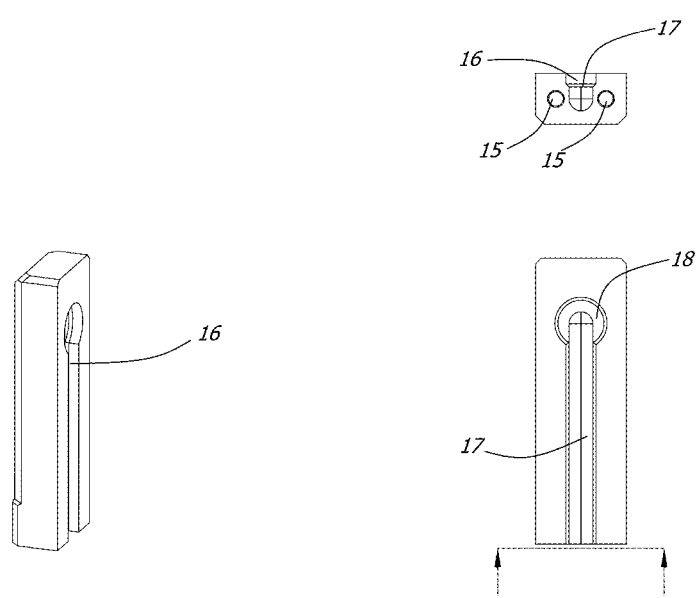
FIG. 6 is a detailed black-and-white line drawing of the Leg Part.

Referring to FIG. 6, the drawing is a detailed diametric and orthographic cross section sketch of the 2 Legs (2). The 2 holes (15) seen on the top right sketch is used to fasten to the holes (11) of the Base (1). The outer cavity (16) of this Part is where the Shell (4) side extrusions (20) sits in, which vertically constrains it for only linear motion, and the inner cavity (17) is where the tension spring is housed (not pictured), serving to secure the Shell (4) in place. A large circular cavity can be found on the top of the outer cavity (18) which is the location where the Shell (4) is able to rotate via circular motion, using its side extrusions (20) as a hinge.

Figure 7:
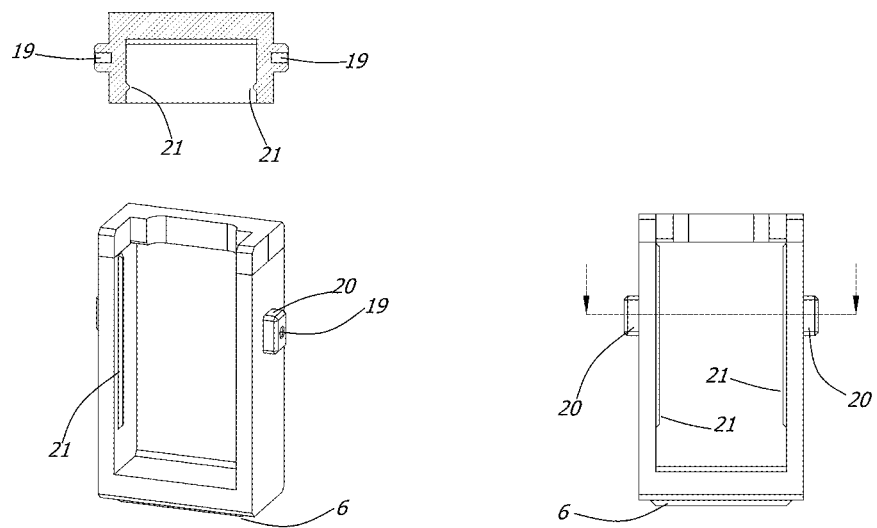
FIG. 7 is a detailed black-and-white line drawing of the Shell Part.

Referring to FIG. 7, the drawing is a detailed diametric and orthographic cross section sketch of the Shell (4), the part which provides the shell for the USB chip. The 2 extrusion (20) found on both sides of the Part is used as the guide for the outer cavity (16) of the 2 Legs (2). A hole (19) can be seen on both of these extrusions (20) which is where the tension spring will be fastened to via another machine screw. In order to have a secure fit with the Plate (3), the Shell (4) also have two ribs (21) on both walls.

Figure 8:
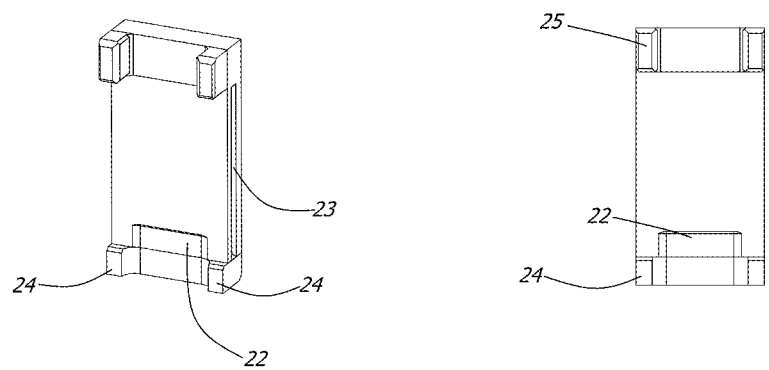
FIG. 8 is a detailed black-and-white line drawing of the Plate Part.

Referring to FIG. 8, the drawing is a detailed diametric and orthographic cross section sketch of the Plate (3). The rounded cavity (22) is where the USB connector end faces, and a female rib cavity (23) is also identified, which fits with the ribs (21) found on the Shell (4).

The invention claimed is:

1. A USB portable housing comprising;
    a base supporting two legs that supports between said legs a plate and shell arrangement; said plate and shell comprise a USB port at one vertical end and a male extrusion at the other end; and
    said plate and shell are configured to move vertically within the legs with the USB port normally housed within a cavity in the base; this cavity also has a female pocket around the outer edge of the cavity, this female pocket can accommodate the male extrusion; and
    said legs each contains a tension spring that moderates the vertical movement of said plate and shell; and
    said tension springs are secured to said shell on its sides, applying constant downward force to said shell towards said base;

said plate and shell are also configured to spin 360° between the legs;

where the plate and shell are capable to move from a first position where the USB port rests within the cavity to a second deployed position where the male extrusion rests within the female pocket;

each leg further contains an outer cavity and an inner cavity that are connected to each other;

- the outer cavity is closer to the external surface of the leg and the inner cavity with a smaller diameter than the outer cavity is recessed further within the leg, this inner cavity also contains the spring;
- the outer cavity is configured to accommodate a protrusion or trunnion on both outer edges of said shell, thereby controlling the 360° spin of said plate and shell;
- the inner cavity is configured to accommodate the protrusion and control with the spring's vertical linear motion within said legs.

* * * * *